United States Patent [19]

Gibson et al.

[11] Patent Number: 4,599,680

[45] Date of Patent: Jul. 8, 1986

[54] PACKAGING ARRANGEMENT FOR SPACECRAFT COMPUTER

[75] Inventors: William C. Gibson; William M. Tomlinson; Eugene T. Goldstein; George A. Ferguson, all of San Antonio, Tex.

[73] Assignee: Southwest Research Institute, San Antonio, Tex.

[21] Appl. No.: 535,653

[22] Filed: Sep. 26, 1983

[51] Int. Cl.⁴ .............................................. H05K 7/20
[52] U.S. Cl. ...................... 361/386; 357/81; 365/52; 361/399; 361/424
[58] Field of Search ........................... 365/52; 357/81; 361/386–389, 395, 399, 400, 414, 424; 175/35 R, 52 FP

[56] References Cited

U.S. PATENT DOCUMENTS

| 2,881,364 | 4/1959 | Demer | 361/386 |
| 4,082,394 | 4/1978 | Gedney | 357/80 |
| 4,370,700 | 1/1983 | Duddles | 361/424 |
| 4,475,145 | 10/1984 | Heil | 361/388 |

Primary Examiner—G. P. Tolin
Attorney, Agent, or Firm—Gunn, Lee & Jackson

[57] ABSTRACT

The present invention relates to a packaging arrangement for a spacecraft computer designed to conduct experiments in a hostile environment of outer space. The computer has high density packaging of very large scale integration (VLSI) circuits. Heat is removed by direct contact with each heat producing item in the computer, which direct contact is provided for most integrated circuit chips by a heat conductive plane located between the chips and a printed circuit board. From the heat conductive plane, heat is further removed through direct contact with a housing adapted for physical connection to a cold plate for heat conduction thereto. All heat producing elements are in physical contact with heat transferring devices to transfer essentially all heat to the cold plate. The housing and heat transferring devices eliminate unwanted electromagnetic interference and help reduce galactical radiation especially of the x-ray frequency type. However, the subject invention still provides a lightweight, economical computer that has additional features of (1) ease of access for diagnostic checks of the computer, and (2) reprogrammability of the erasable programmable read only memory (EPROM).

12 Claims, 6 Drawing Figures

PACKAGING ARRANGEMENT FOR SPACECRAFT COMPUTER

BACKGROUND OF THE INVENTION

The present invention relates to a packaging arrangement for an onboard spacecraft computer to conduct experiments in the hostile environment of outer space. The computer is designed for use in connection with an onboard computer to conduct multidisciplinary research on such programs as the NASA Spacelab. The packaging arrangement utilizes very large scale integration (VLSI) circuits which have direct contact therewith to dissipate heat from the VLSI circuits and other heat producing items through a housing to a cold plate. Also the packaging arrangement eliminates electromagnetic interference and helps dissipiate galactical radiation especially of the x-ray frequency type. The subject invention is lightweight and economical, plus has additional features of (1) ease of access to check out the computer, and (2) reprogrammability of an erasable programmable read only memory (EPROM).

BRIEF DESCRIPTION OF THE PRIOR ART

Prior to the present invention, onboard computers utilized to conduct experiments in outer space were very expensive, bulky and unreliable. With the development of the Space Shuttle/Spacelab, a shirt sleeve type of environment is provided for the payload crewmen in which to conduct research in various fields of life and material sciences, astronomy, space plasma, and other solar physics, as well as earth observations. Since the onboard operation of a spacecraft computer to conduct experiments is not critical to the operation or flight crew safety, the National Aeronautics and Space Administration (NASA) has reduced the quality control and assurance requirements on instrument developers, and thus, realized a significant savings in cost. Since the Spacelab is designed to be flown many times over the next decade and carry with it new instruments each time, NASA could not afford the development cost of so many instruments built to older Apollo standards.

The present spacecraft computer is designed to operate in connection with the Spacelab command and data management system (SDMS), which is a cluster of three general purpose computers. The present computer is normally used to manage scientific experimental operations. On Spacelab's first flight, three ruggedized microcomputers (LSI-11, Rolm, and IBM) controlled the more than sixty onboard experiments. However, these ruggedized minicomputers have many limitations with the first and most important limitation being price. The present spacecraft computer can be manufactured at less than one-tenth of the price of the earlier ruggedized microcomputers. The second limitation of the ruggedized microcomputers is they will not operate in a hard vacuum environment where the only means of removing heat is by conductive dissipation through a base plate. Lastly, the ruggedized microcomputers need to have extensive input/output capabilities which were not provided to the extent provided by the present spacecraft computer.

Prior microcomputers did not have the capability of reprogramming during integration with the Spacelab equipment. Normally there must be at least one change in the software during the process of debugging, which requires a programmable read only memory (PROM) which is very difficult after spacecraft integration. Further, the prior ruggedized microcomputers were very difficult to troubleshoot. The present spacecraft computer is designed for ease of troubleshooting to eliminate any potential problems. VLSI processors are used so that an extensive amount of data can be processed in a fairly compact package. Prior ruggedized computers were considerably heavier, larger, dissipated more power, and did not have the temperature control of the present computer.

Particularly unnerving was the fact that various vendors claimed their ruggedized microcomputers would meet specific MIL STD specifications; however, such vendor claims could not be substantiated by any test data and based on experiments of the applicants such claims appeared to be false.

Prior ruggedized microcomputers are a number of years behind the state-of-the-art in integrated circuits, which delay in the state-of-the-art resulted in significantly less capability regardless of whether the capability if measured in size, weight, power dissipation, programmability, or error reduction.

SUMMARY OF THE INVENTION

It is an object of the present invention to provide a spacecraft computer that may be used in an environment encountered in the Space Shuttle/Spacelab vehicle, which is reliable and economical in price.

It is a further object of the present invention to provide packaging for a computer that is dedicated for experiments for use in outer space, which packaging arrangement provides for conductive heat dissipation when operated in a vacuum.

It is yet another object of the present invention to provide a means for shielding a computer from unwanted electromagnetic interference and galactical radiation, particularly the x-ray frequency type.

It is still another object of the present invention to provide an experimental computer that has large input/output capabilities, while at the same time being a small, low profile type of packaging arrangement with conductive heat dissipation through a base plate, while at the same time being economical.

In the design of the present computer, the circuitry is mounted on a single thick circuit board. The circuit board is physically supported at numerous points to provide additional strength to withstand launch vibration loads. A chemically etched aluminum heat sink is attached to the circuit board to allow all the integrated circuits (with one exception) to have direct contact therewith. The heat sink is connected on the periphery with the circuit board and to the housing to conduct heat directly to the base plate and subsequently to a cold plate. This packaging arrangement allows the computer to operate in a vacuum where only conductive heat dissipation is possible. The computer has operated successfully with base plate temperatures as high as 85° C. and as low as −40° C.

For one of the VLSI devices, the chip is cooled primarily from the top of the chip through direct contact therewith and subsequent dissipation through the housing and base plate to the cold plate.

The experimental computer operates from unregulated 28 volts DC. However, before the 28 volts DC reaches a DC/DC converter, which produces the 5 volts DC for the processor circuits, both the supply line and the return line are routed through shielded line filters. The filters not only help reduce the reflected power line noise, but also eliminate high voltage spikes that can be imposed on the power lines during the conducted susceptibility test. The use of the DC/DC converter to provide regulated 5 volts DC to the logic improves the processors' power efficiency and, more importantly, meets NASA requirements for electrical isolation between primary and second power return lines, primary return to the chassis, and secondary return to the chassis.

In an effort to minimize radiated noise, the entire upper surface of the circuit board was laid out as a chassis ground plane, all the working voltages being routed to the bottom surface of the circuit board. This approach is possible because of the use of a very high connection density multi-wire circuit board in which multiple levels of interconnection are possible.

The packaging design is resistant to electromagnetically noisy environments or environments where shock and vibration levels are high. The low profile of the packaging arrangement minimizes the structure's moment arm to launch acceleration loads and other induced loads in the X-Y plane.

The entire packaging arrangement can be radiation hardened to x-ray, electron and proton irradiation. In many satellite and interplanetary spacecraft applications, the vulnerability of an unshielded electronic device can be extremely high. Multiple channel devices are traditionally not used in such applications because of their reputed radiation softness. A multilayer shield will provide sufficient protection for all but the most severe orbital requirements. The primary sources of damaging radiation to space borne electronics are the five (5) MeV and below for electrons and the five hundred (500) MeV and below for protons. At these energies, charge particles can easily penetrate the satellite skin as well as the electronic enclosure walls. Galactical and solar cosmic rays are also of concern, but for species exhibiting sufficient energies to cause problems, the fluxes are actually quite low. Thus, cosmic rays seem more of occasional, random errors than of permanent damage.

The present computer provides new applications for ruggedized, inexpensive and serviceable mini- and microcomputers. Because most spacecraft computers have to be delivered as much as a year before flight, the equipment often means troubleshooting hardware and modifying software under difficult circumstances which are possible with the present spacecraft computer. A very important aspect of the present invention is a heat conductive plane (previously mentioned as aluminum heat sink) that is located between all of the integrated circuits (except one) and the circuit board. The heat conductive plane conductively dissipates the heat outwardly to the housing, and thereafter downward through the base plate to a cold plate. The same heat conductive plane helps eliminate electromagnetic interference and possibly other interference caused in space orbit.

DESCRIPTION OF THE PREFERRED EMBODIMENT

Figure 1:
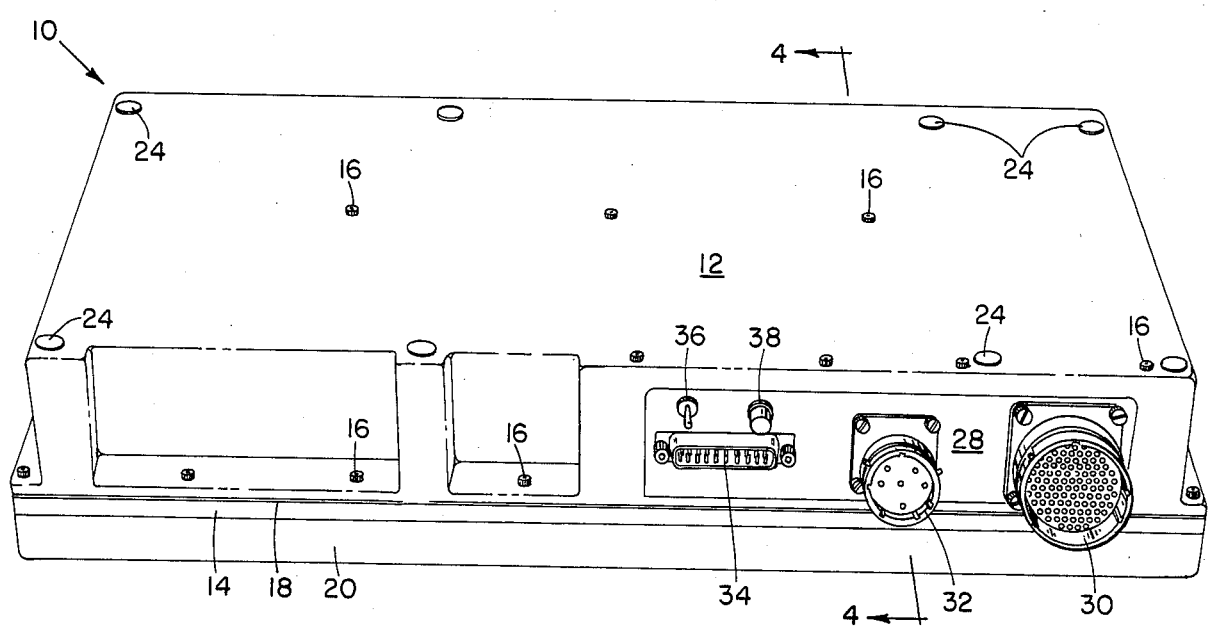
FIG. 1 is a perspective view of a spacecraft computer for conducting experiments in a hostile environment of outer space.
Figure 2:
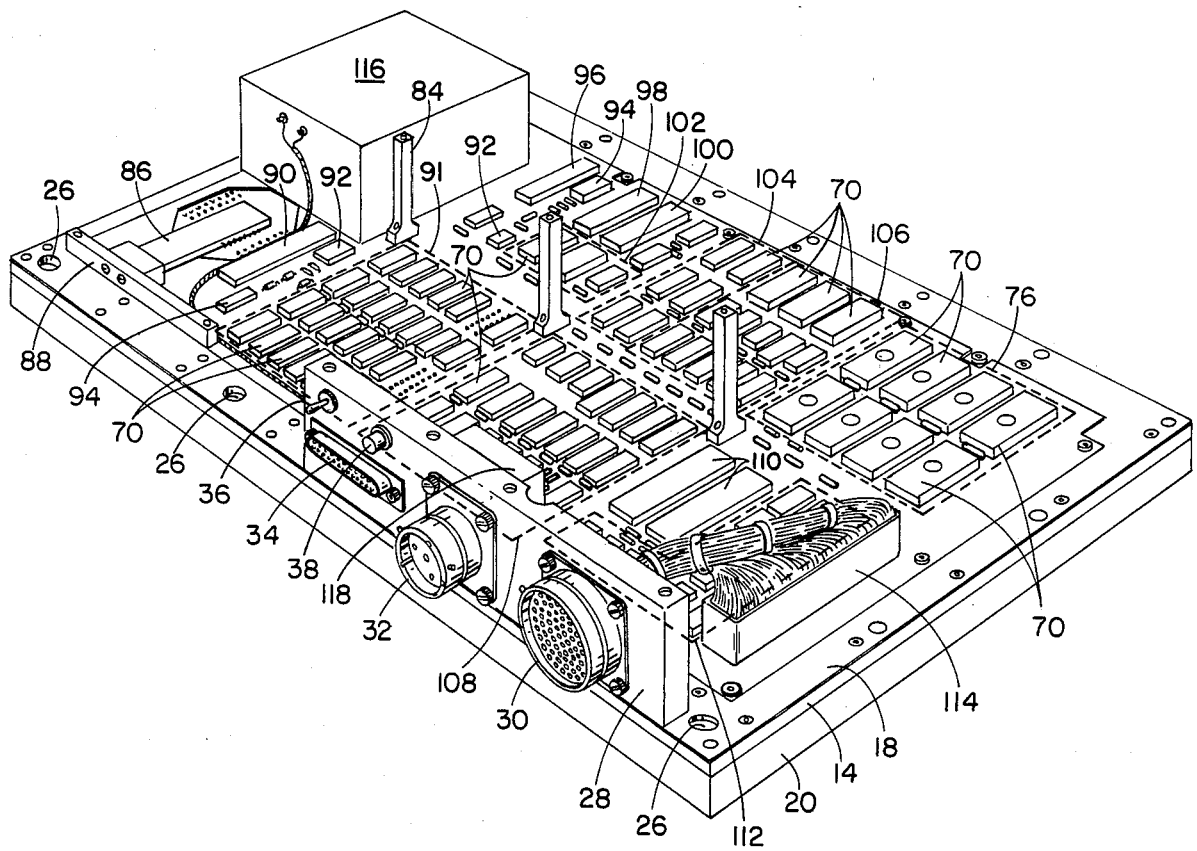
FIG. 2 is a perspective view of the computer with the cover removed and the hold down plate for the erasable programmable read only memory (EPROM) being removed.

Referring now to FIGS. 1 and 2 of the drawings, there is shown a special purpose computer particularly designed for conducting experiments in outer space as may normally be conducted in the Space Shuttle/Spacelab. The computer represented generally by reference numeral 10 has a cover 12 attached to a base plate component mounting board 14 by means of screws 16. A metal gasket 18 made of material such as copper provides a good electrical and heat sink mating between the cover 12 and base plate 14, both of which are made of electrical and heat conductive material, such as aluminum.

Depending on the particular usage for which the computer 10 is designed, an adapter bracket 20 may be used. The adapter bracket 20 has a support plane 22 (see FIG. 3) extended thereacross which gives support for components of the computer 10. The support plane 22 also protects the computer 10 from radiation. The particular configuration of the adapter bracket 20 as shown in connection with the present invention is for attachment to a cold plate for use in the Space Shuttle/Spacelab. Any other configuration may be used for attaching the adapter bracket 20 to the particular mounting structure as long as it is securely mounted and provides proper radiation shielding.

In the present design, buttons 24 in the cover 12 may be removed to expose a hole in the cover 12 for extension of a screwdriver therethrough. A screwdriver may then be used to connect the adapter bracket 20 to a cold plate (not shown) by turning mounting screws (not shown) retained in the adapter bracket 20. The mounting screws are located immediately below the openings 26 in the base plate 14. After securing the experimental computer 10, the buttons 24 are replaced.

A connector block 28 as can be more clearly seen in FIG. 2 is located between the base plate 14 and the cover 12. The connector block 28 which bolts to the cover 12 has an input/output connector 30 mounted therein. The input/output connector 30 passes therethrough signals in and from the computer 10. Power connector 32 is also mounted in connector block 28 for supplying power to the computer 10. Monitor connector 34 mounted in connector block 28 allows for external monitoring of signals inside of the computer 10. Monitor connector 34 may be a standard RF-232 connector. Reset switch 36 allows for external reset of the computer 10. The reset switch 36 is normally used at the time of start-up or if there are multiple errors in the system. Switch 38 is simply a circuit breaker switch.

Figure 3:
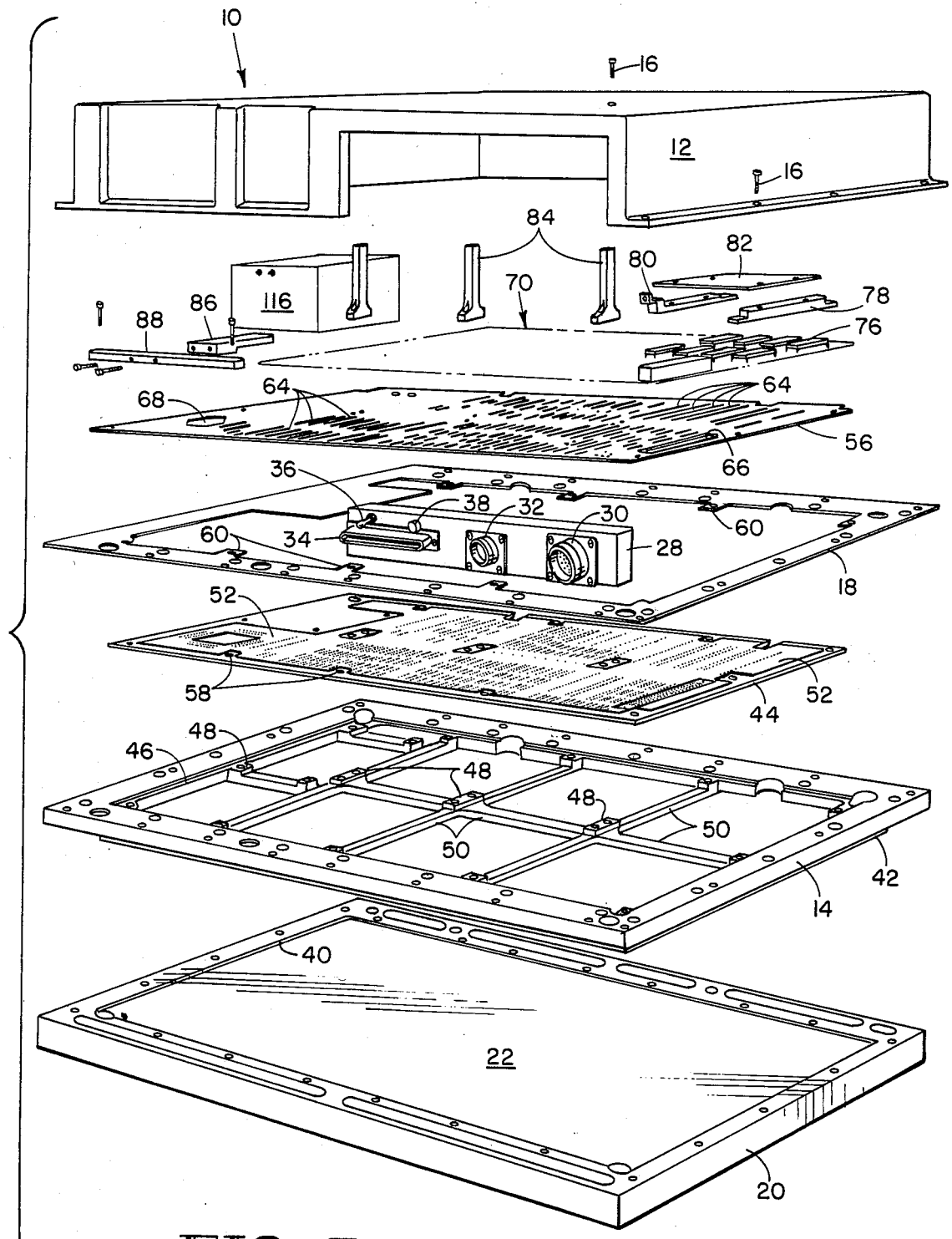
FIG. 3 is an exploded perspective view of the computer.
Figure 4:
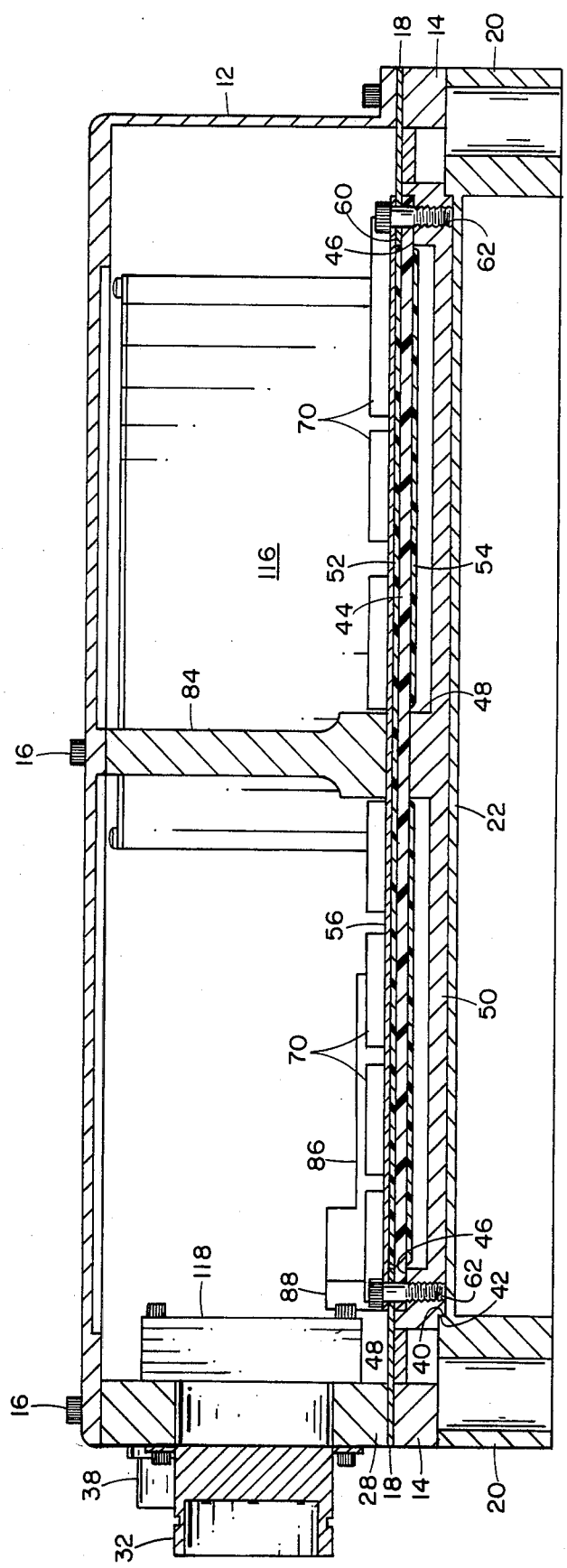
FIG. 4 is a cross-sectional view of FIG. 1 taken along section lines 4—4.

Referring now to FIG. 3 of the drawings, there is shown an exploded perspective view of the computer 10. Viewing FIG. 3 in connection with the cross-sectional view of FIG. 4 taken along section lines 4—4 of FIG. 1, the arrangement of the packaging for the computer 10 will be explained in more detail. If the adapter bracket 20 is used, the base plate 14 is physically attached thereto with the shoulder 40 of the adapter bracket 20 abutting against shoulder 42 of the base plate 14. The abutting shoulders 40 and 42 insure against lateral movement of the base plate 14 with respect to the adapter bracket 20.

A circuit board 44 (which will be described in more detail subsequently) rests on ledge 46 of the base plate 14. The outer edges of the circuit board 44 abut shoulder 48 of the base plate 14. The circuit board 44 is also supported in mid-portions thereof by raised supports 48 located at the intersection of cross-braces 50 of the base plate 14.

Referring to the circuit board 44, the circuit board 44 has a built-up portion 52 and 54 on either side thereof. However, the built-up portions 52 and 54 do not extend to the edges of the circuit board 44 nor over areas of structural support. In construction of the circuit board 44, wires are laid down in a soft epoxy in the built-up portions 52 or 54 according to predetermined plans. Later the epoxy hardens and additional layers of interconnecting wires may be added as needed. Afterwards the holes are drilled in the circuit board 44, which holes cut through the copper wires plus any copper plane that may have been laid down. The hole is plated with copper internally that makes internal connections between the wires to that point. A typical manufacturer of such a circuit board 44 is Multi-Wire Corporation located in New York.

A copper layer is on the upper surface of the circuit board 44 and below the built-up portion 52, which copper surface is designed to miss the holes for integrated circuit connections. The copper surface acts as an electrical shield to isolate the integrated circuits (as will be explained subsequently) from the circuit board 44. Another copper plane is etched onto the circuit board 44 before the built-up portion is applied thereto according to a predetermined layout, which plane is used to supply power to the integrated circuits.

Figure 5:
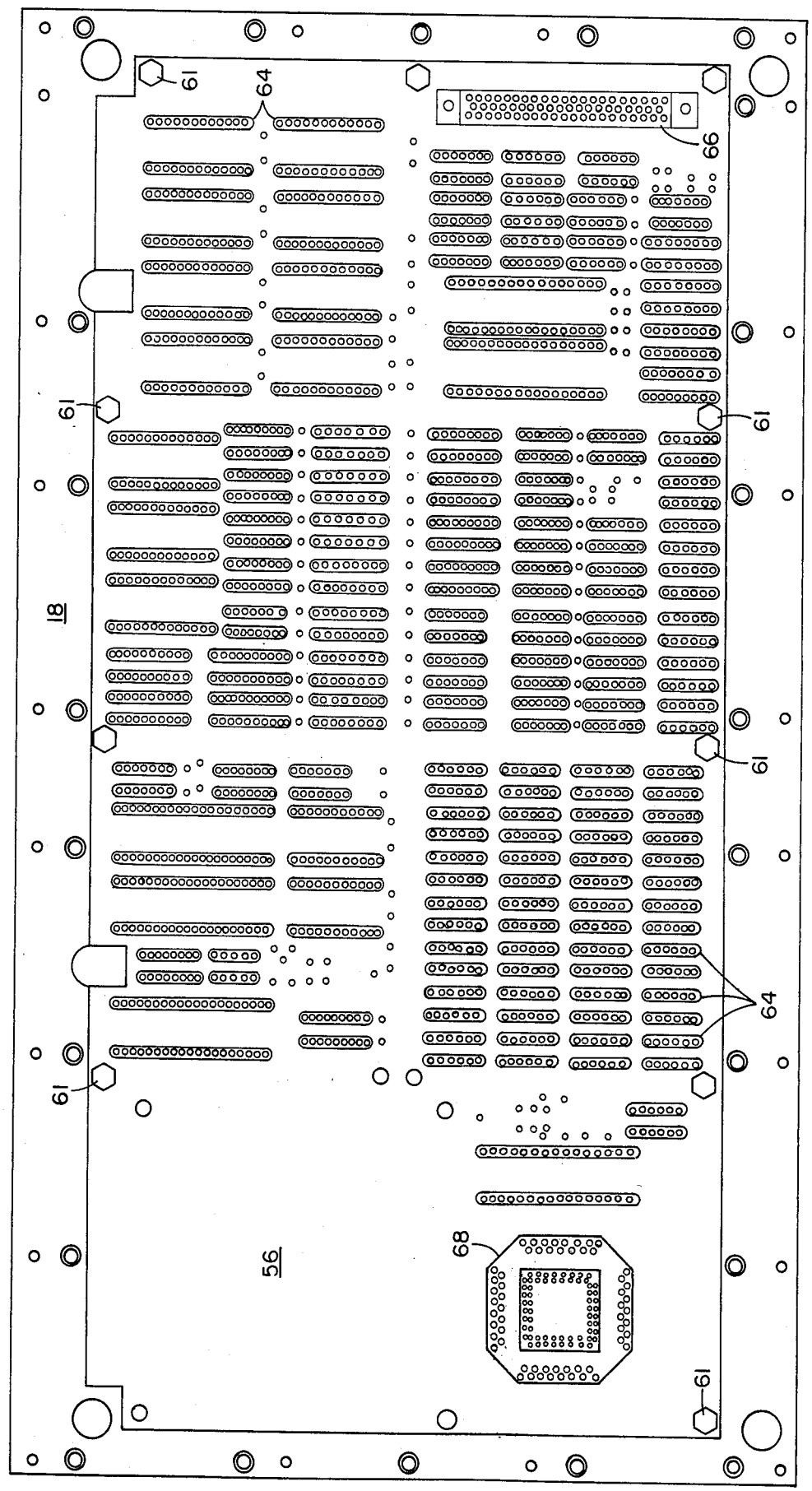
FIG. 5 is an elevated plan view of a heat conductive plane as mounted in the experimental computer prior to assembly of individual components thereon.

The thickness of the built-up portion 52 of the circuit board 44 is approximately 20/1000 of an inch for the present application. Likewise, the metal gasket 18 which surrounds the built-up portion 52 is approximately 20/1000 of an inch. Since the metal gasket 18 does not overlap with the built-up portion 52, a relatively planar upper surface is provided between built-up portion 52 and metal gasket 18. Mounted against an upper surface of said circuit board 44 is a heat conductive plane 56. The outer perimeter of heat conductive plane 56 follows the same outer perimeter as circuit board 44. An elevated plan view of the heat conductive plane 56 is shown in FIG. 5. The ground plane portion of circuit board 44 is electrically connected through bare portions 58 to tabs 60 of the metal gasket 18 (see FIGS. 3 and 4). This provides for a good heat conductive path plus electrical shielding. By providing a relatively large number of bare portions 58 and tabs 60, a number of heat conductive paths are provided to dissipate heat from the circuit board 44 to the base plate 14. Subsequently the heat is transferred through the adapter bracket 20 to a cold plate (not shown).

The circuit board 44 is connected to the same tabs 60 by any suitable means, such as bolting. Screws 61 may be threadably received in threaded holes 62 of the base plate 14. As shown in FIG. 5, the heat conductive plane 56 has a large number of slots 64 therein through which the integrated circuits may be connected to the circuit board 44. Also the heat conductive plane 56 has an opening 66 for an input/output connector and an opening 68 in which a VLSI may be mounted.

Figure 6:
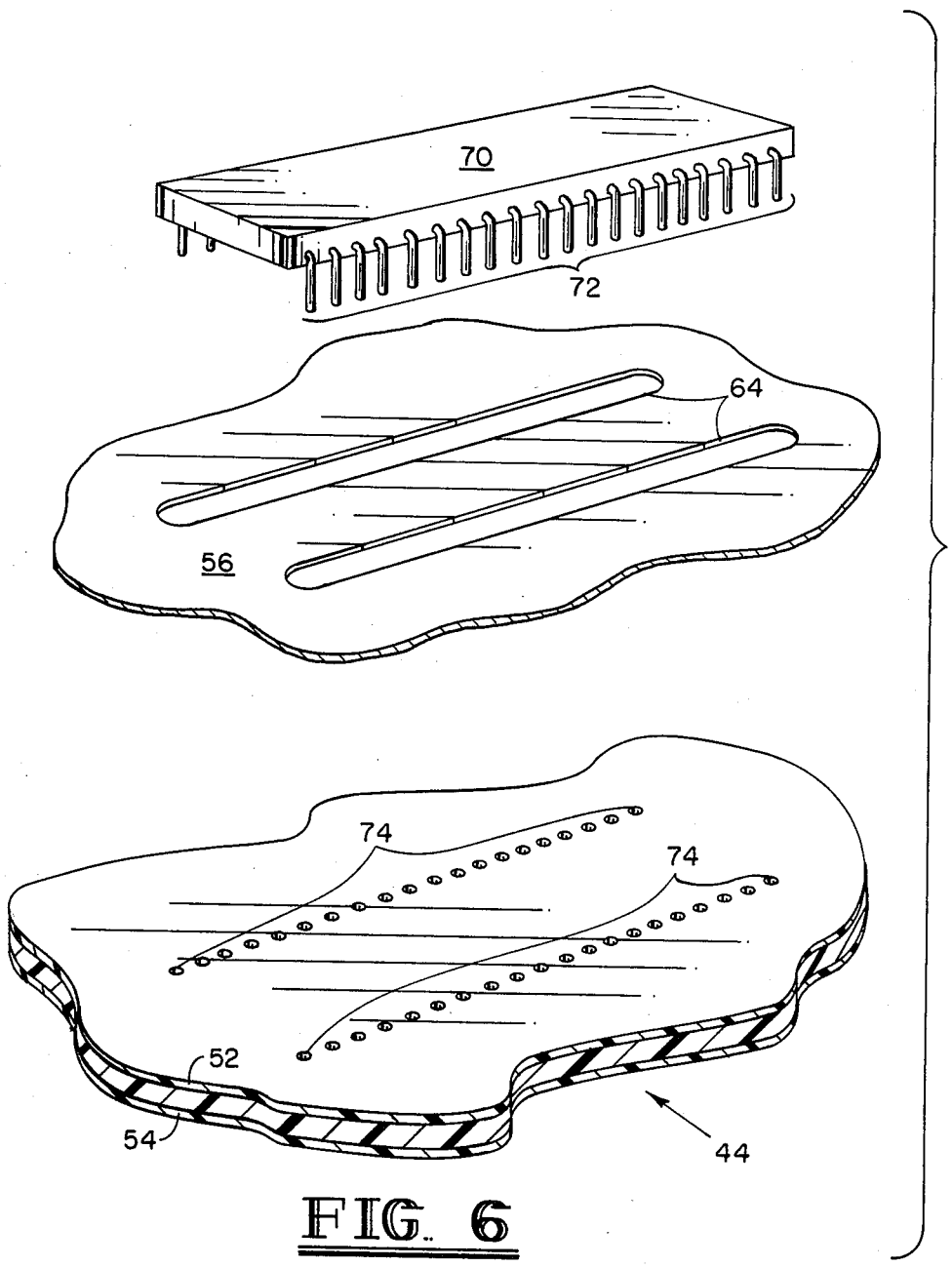
FIG. 6 is an enlarged exploded partial perspective view illustrating connection of an integrated circuit through the heat conductive plane to a circuit board therebelow.

Referring to FIGS. 2 and 3, a large number of integrated circuits 70 can be seen mounted on the heat conductive plane 56. For ease of illustration, the typical mounting of an integrated circuit 70 is explained in connection with enlarged exploded partial sectional view of FIG. 6. The illustration as explained in connection with FIG. 6 is typical of the mounting of all integrated circuits in the computer 10 with the exception of one VLSI chip. The integrated circuit 70 has a plurality of leads 72 extending downwardly on each side thereof. The leads extend through slots 64 of the heat conductive plane 56 into the holes 74 of the circuit board 44. A heat sinking compound is applied to the underside of the integrated circuit 70 to insure good heat conductivity between the integrated circuit 70 and the heat conductive plane 56. A typical heat sinking compound is manufactured by either Wakefield or Emerson Cummings Company. The heat sinking compound gives a more uniform heat transfer especially if there is an unevenness between the bottom of the integrated circuit 70 and the heat conductive plane 56. The heat sinking compound fills in the voids and gives a better heat transfer. Once the integrated circuit 70 is positioned with the leads 72 in the holes 74, it is soldered into position, unless it is part of the erasable programmable read only memory (EPROM) which is held in position in a manner that will be explained subsequently.

Referring back to FIG. 3, the integrated circuits 70 are shown in an illustrative perspective view above the heat conductive plane 56. Concerning the EPROM integrated circuits 76, they are mounted inside of support brackets 78 and 80. A hold down plate 82 is connected to the support brackets 78 and 80 and physically abuts the top side of the EPROM integrated circuits 76. The hold down plate 82 also provides a path for heat conductivity to remove heat from the EPROM integrated circuits 76. To insure good conductivity of heat from the EPROM integrated circuits 76, a heat conductive tape, such as that manufactured under the name Cho-Therm is used. The hold down plate 82 secures the EPROM integrated circuit 76 in position during times of extreme vibration, such as vehicle launch.

Posts 84, which are used to support the cover 12, are also bolted through the heat conductive plane 56 and circuit board 44 to the raised supports 48. For structural support, the posts 84 are located immediately above the raised supports 48 of the base plate 14.

Concerning the VLSI chip which fits inside of opening 68 of the heat conductive plane 56, an upper heat conductive top member 86 is used to dissipate heat from the VLSI chip. The upper conductive top member 86 is connected to the heat conductive plane 56 through mounting bracket 88 to again dissipate heat through the heat conductive plane 56.

Referring now to FIG. 2 of the drawings, the general layout of the electronic portion of the present invention will be explained in further detail. Located below the upper heat conductive abutting member 86 is an error correction integrated circuit previously referred to as a VLSI. Adjacent thereto is a dynamic random access memory (DRAM) controller 90. Located immediately adjacent thereto inside of circle 91 are the DRAM's, commonly referred to as dynamic RAM's. The controls for the dynamic RAM's is provided by clocks 92 and delay lines 94.

The central processor 96 works in connection with input/output processors 98 and numerical processor 100. The numerical processor 100 handles the manipulation of data at very high speeds. Integration timing chips contained in circle 102 control the timing operation of the central processor 96.

A cluster of integrated circuits inside of circle 104 provides a bus control and interface that controls the data in and out of the central processor 96.

The integrated circuits inside of circle 106 are interrupt controllers that allow for the operation of the central processor 96, input/output processor 98 and the numerical processor 100 simultaneously.

The fixed memory is provided by the random access memories (RAMs) 108 which provide a static memory for the computer 10. The integrated circuit chips located around the RAMS 108 and contained inside of reference line 110 are peripheral program interface devices which handle the information being fed into the computer 10 and to external devices therefrom. Line drivers and receivers 112 insure the proper impedance on lines going out of and into the computer 10. Particularly the line drivers and receivers 112 control the impedance of signals received or sent through input/output connector 114. Input/output connector 114 connects to the circuit board 44 through opening 66 in the heat conductive plane 56.

While many different types of power supplies may be used, the power supply 116 currently being used by applicant is a Tecnetics Model No. 3025-28-105. The power supply 116 converts unregulated 28 volt DC to a regulated 5 volts for use by the integrated circuits 70 of the computer 10. The power for running the power supply 116 is received through the power connector 32 and is immediately filtered through filter element 118 to prevent unwanted spikes or electromagnetic interference. The filter element 118 prevents any external interference from coming into the computer 10 over the power lines.

All internal portions of the housing for the computer, including the cover 12, metal gasket 18, base plate 14, and adapter bracket 20 with its support plate 22, have an anodized gold coating which provides two functions. The anodized gold coating prevents corrosion and also prevents 32 electromagnetic interference. However, to prevent interference from x-ray frequencies, another coating that is radiation hardened would have to be applied to the internal portions of the housing to scatter the x-rays and specifically absorb the x-rays. While cosmic radiation is difficult to stop, they do not occur that often and do not cause that much damage. By use of an error correction memory, the problem of cosmic radiation can be greatly reduced. Cosmic and x-ray radiation can also be greatly reduced by use of a special lining inside of the cover 12 and the mounting bracket 20.

The heat conductive plane 56 not only serves as a heat sink but also operates as a ground plane. The ground plane characteristics of heat conductive plane 56 help eliminate electromagnetic interference and tends to isolate the wiring of the circuit board 44. Preferably the heat conductive plane 56 is made of a black anodized aluminum which aids in heat conductivity.

By use of a base plate 14 as pictorially shown in FIG. 3 with cross-braces 50, large open spaces are provided between the cross-braces 50. These open spaces allow an individual to get beneath the circuit board 44 without having to disassemble the entire computer. This allows ease of access for troubleshooting and check-out. However, after final check-out, the entire computer 10 may be physically attached to the adapter bracket 20 which provides the necessary structural support and protection from radiation.

We claim:

1. A packaging arrangement for a computer capable of operating in a vacuum, said packaging arrangement comprising:

a base plate;

at least one circuit board generally parallel with said base plate and mounted on said base plate, said circuit board having internal connections formed integral therewith;

heat conductive plane means layered on top of said circuit board, said heat conductive plane means having slots therein;

integrated circuits mounted on said heat conductive plane for conducting heat thereto with leads for said integrated circuits extending through said slots into predesigned socket holes in said circuit board;

means for conducting heat from said circuit board and said heat conductive plane means to said base plate, said base plate being adapted for a heat conductive mounting on a cold plate;

connector means secured on said base plate for allowing external connections to computer;

cover means attached to said base plate for totally enclosing said computer;

said cover means, base plate, heat conductive plane means and means for conducting heat being both heat conductive and electrically conductive to (1) transfer heat from said integrated circuits or other heat generating components through said base plate to said cold plate, and (2) reduce electromagnetic interference whether internal or external to said computer.

2. The packaging arrangement for the computer as given in claim 1 wherein said means for conducting heat is gasket means between said base plate and said cover means, said gasket means being of an electrical and heat conductive material, said gasket means being connected to a ground plane deposited on said circuit board and said heat conductive plane means to transfer heat therefrom to said base plate.

3. The packaging arrangement for the computer as given in claim 2 wherein said base plate has raised supports for said circuit board with openings around said raised supports for access to said circuit board during diagnostic work on said computer.

4. The packaging arrangement for the computer as given in claim 3 comprising a mounting post secured to said raised supports for providing additional structural support for said cover means.

5. The packaging arrangement for the computer as given in claim 1 or 2 wherein said integrated circuits include erasable programmable read only memory (EPROM) chips which are not permanently attached to said circuit board, a hold down plate abutting an upper surface of said EPROM chips to hold said EPROM chips in position and transfer heat therefrom through hold down bracket means to said heat conductive plane means.

6. The packaging arrangement for the computer as given in claim 1 or 2 comprising very large scale integration (VLSI) chips mounted on said circuit board, upper bracket means abutting a top of said VLSI chips to transfer heat therefrom to said base plate.

7. The packaging arrangement for the computer as given in claim 1 comprising a heat conductive compound between said integrated circuits and said heat conductive plane.

8. The packaging arrangement for the computer as given in claim 5 comprising a heat conductive tape between said hold down plate and said EPROM chips.

9. The packaging arrangement for the computer as given in claim 1, 2, 3 or 4 including an adapter bracket for attaching said base plate for mounting, said adapter bracket shielding a lower side of said computer.

10. The packaging arrangement for the computer as given in claim 2 wherein circuit board includes an upper surface deposited thereon for connection to gasket means to form a ground plane, working voltages being located on a lower surface of said circuit board.

11. The packaging arrangement for the computer as given in claim 1 wherein said circuit board is high connection density multi-wire circuit board.

12. The packaging arrangement as given in claim 1 wherein said base plate and cover means are radiation hardened to help stop x-ray, electron and proton irradiation.

* * * * *